US012647135B2

(12) United States Patent
Shu et al.

(10) Patent No.: US 12,647,135 B2
(45) Date of Patent: Jun. 2, 2026

(54) FAST EFFICIENT DECODER FOR LOW DISTANCE RS AND BCH CODES

(71) Applicant: CREDO TECHNOLOGY GROUP LIMITED, Grand Cayman (KY)

(72) Inventors: Chang Shu, Saratoga, CA (US); Yu Liao, Longmont, CO (US); Junqing Sun, Fremont, CA (US)

(73) Assignee: Credo Technology Group Limited, Grand Cayman (KY)

( * ) Notice: Subject to any disclaimer, the term of this patent is extended or adjusted under 35 U.S.C. 154(b) by 59 days.

(21) Appl. No.: 18/198,636

(22) Filed: May 17, 2023

(65) Prior Publication Data

US 2024/0388312 A1 Nov. 21, 2024

(51) Int. Cl.
*H03M 13/11* (2006.01)
*H03M 13/15* (2006.01)

(52) U.S. Cl.
CPC ..... *H03M 13/1177* (2013.01); *H03M 13/151* (2013.01); *H03M 13/159* (2013.01)

(58) Field of Classification Search
None
See application file for complete search history.

(56) References Cited

U.S. PATENT DOCUMENTS

| | | | | |
|---|---|---|---|---|
| 5,208,815 | A | 5/1993 | Kojima | |
| 5,627,843 | A * | 5/1997 | Deng | H03M 13/151 714/785 |
| 6,615,387 | B1 * | 9/2003 | Williamson | H03M 13/151 714/784 |

OTHER PUBLICATIONS

Dmitri Truhachev et al. "Efficient Implementation of 400 Gbps Optical Communication FEC" IEEE Transactions on Circuits and Systems—I: Regular Papers, vol. 68, No. 1, (Jan. 2021).

(Continued)

*Primary Examiner* — Mark D Featherstone
*Assistant Examiner* — Matthew W Wahlin
(74) *Attorney, Agent, or Firm* — RAMEY LLP; Daniel J. Krueger

(57) ABSTRACT

An illustrative decoder includes: a syndrome calculator, a location finder, and an error corrector. The syndrome calculator has an array of logic gates to obtain syndrome values as a product of a receive message vector and a parity check matrix, the syndrome values including at least a three ten-bit syndrome values $S_1$, $S_2$, and $S_3$. The location finder derives a number of errors from the syndrome values, and uses a second array of logic gates to obtain two polynomial roots as a product of a syndrome value vector and a quadratic solution matrix when the number of errors is two, the quadratic solution matrix corresponding to a determination of a quadratic equation's trailing coefficient value s, a determination of the quadratic equation's roots, and a reversal of a variable substitution. The location finder further determines a bit index for each of the polynomial roots.

24 Claims, 5 Drawing Sheets

(56) References Cited

OTHER PUBLICATIONS

BCH code, Retrieved from https://en.wikipedia.org/w/index.php?title=BCH_code&oldid=1115116639 on May 23, 2023.

Chien search, Retrieved from https://en.wikipedia.org/w/index.php?title=Chien_search&oldid=1131058889 on May 23, 2023.

Implementation Agreement 400ZR, www.oiforum.com, Mar. 10, 2020.

Benjamin P. Smith et al. "Staircase Codes: FEC for 100 Gb/s OTN", IEEE/OSA Journal of Lightwave Technology, Jan. 19, 2012.

Series G: Transmission Systems and Media, Digital Systems and Networks, International Telecommunication Union, Jul. 2018.

\* cited by examiner

FIG. 1
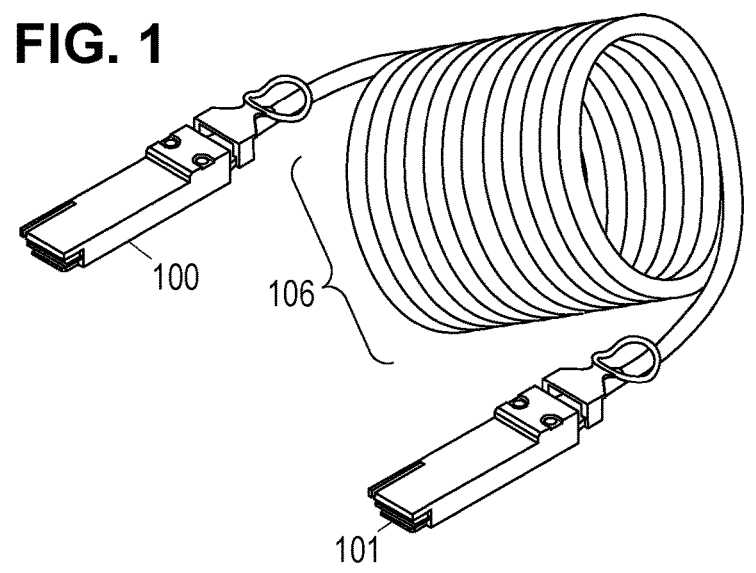
100
106
101
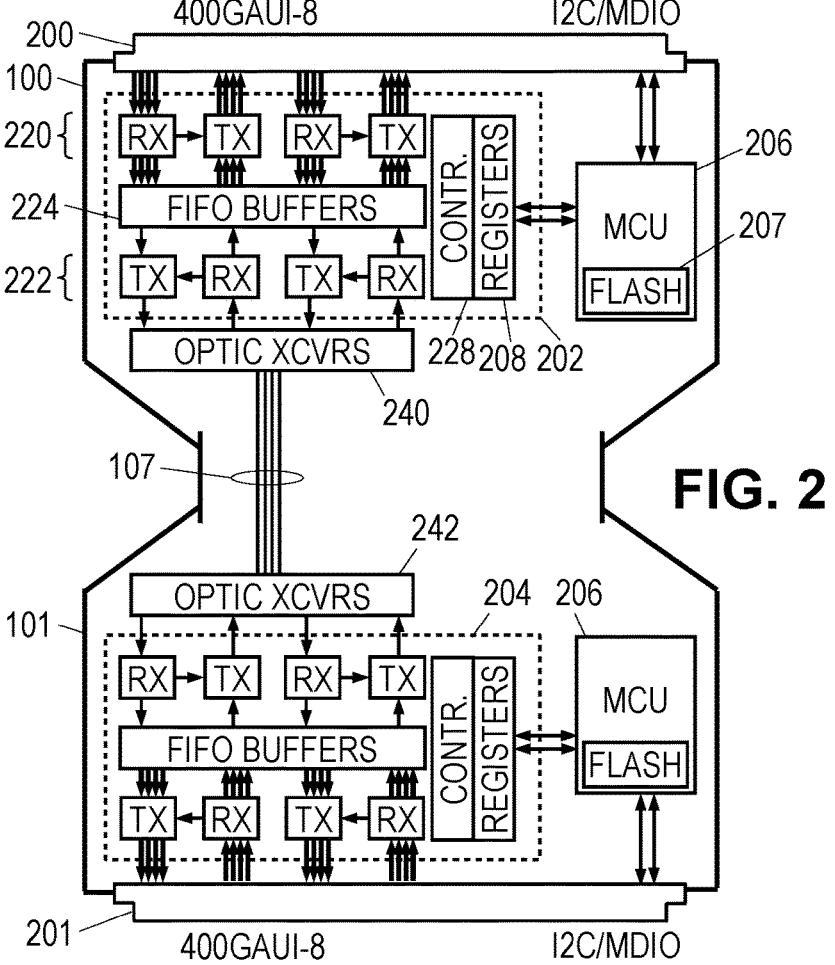
400GAUI-8    I2C/MDIO
200
100
220 { RX TX RX TX
224  FIFO BUFFERS
222 { TX RX TX RX
CONTR. REGISTERS
206
MCU
207
FLASH
OPTIC XCVRS
228 208 202
240
107
242
OPTIC XCVRS
204  206
101
RX TX RX TX
FIFO BUFFERS
CONTR. REGISTERS
MCU
FLASH
TX RX TX RX
201
400GAUI-8    I2C/MDIO
FIG. 2

FAST EFFICIENT DECODER FOR LOW DISTANCE RS AND BCH CODES

BACKGROUND

Reed-Solomon (RS) codes and Bose-Chaudhuri-Hocquenghem (BCH) codes are often employed for forward error correction (FEC) in modern communication channels, introducing sufficient redundancy to enable the receiver to correct noise-induced symbol detection errors. RS and BCH codes treat each block of data as a set of polynomial coefficients. This message polynomial is multiplied by a "generator" polynomial known to both the encoder and decoder to determine the "code word" polynomial corresponding to the message to be sent. The generator polynomial is derived based on the desired length of the code word and the desired Hamming distance between code words.

Note that RS or BCH codes (and hence the decoders) are often only one component of a sophisticated FEC strategy. For example, the International Telecommunication Union Standard ITU-T G.709.2/Y.1331.2 (07/2018) specifies an FEC strategy for the OTU4 long-reach interface (employed as part of the Optical Internetworking Forum's Implementation Agreement OIF-400ZR-01.0) that includes an error decorrelator function, a staircase FEC code, and a scrambler. The OIF-400ZR-01.0 further augments the ITU-T standard with the addition of a convolutional interleaver and an inner Hamming code. In both cases, the staircase code incorporates a BCH code as a component, necessitating the use of one or more BCH decoders at the receiving end.

RS and BCH code variations exist, such as shortening, puncturing, or extending the code messages to respectively reduce word length, to remove redundancy, or to add redundancy, while still enabling reuse of existing decoder designs. The ITU-T standard provides for the use of just such an shortened extended BCH code. This code takes a block of k=990 message bits and multiplies it with a generator or parity matrix to obtain 32 parity bits, yielding n=1022 code word bits with a minimum Hamming distance d=8. To summarize these parameters, the code may be referred to as a BCH(1022,990,8) code.

There exist many RS and BCH decoding techniques, most of which: first derive error syndrome values $S_i$ from the received version of the code word polynomial, determine a number of symbol errors, use the error syndrome values to determine coefficients of the appropriate error locator polynomial, operate on the error locator polynomial to find its roots (which indicate the error locations), calculate the error values if needed, and then correct the errors. Existing decoder techniques employ iterative procedures that are not amenable to parallelization or implementation at ever-higher data rates.

SUMMARY

Accordingly, there are disclosed herein circuits and methods for correcting bit errors in a received version of a RS or BCH encoded bit stream. One illustrative circuit includes: a syndrome calculator, a location finder, and an error corrector. The syndrome calculator has a first array of logic gates to obtain syndrome values as a product of a receive message vector and a parity check matrix, the syndrome values including at least a first ten-bit syndrome value $S_1$, a second ten-bit element syndrome value $S_2$, and a third ten-bit syndrome value $S_3$. The location finder derives a number of errors from the syndrome values, and includes a second array of logic gates to obtain two polynomial roots as a product of a syndrome value vector and a quadratic solution matrix when the number of errors is two, the quadratic solution matrix corresponding to a determination of a quadratic equation's trailing coefficient value s, a determination of the quadratic equation's roots, and a reversal of a variable substitution. The location finder further includes an index circuit to determine a bit index for each of the polynomial roots. The error corrector receives for each receive message vector a set of zero or more bit indexes representing error locations in the receive message vector.

An illustrative error correction method includes: obtaining syndrome values corresponding to a product of a receive message vector and a parity check matrix, the syndrome values including at least a first ten-bit syndrome value $S_1$, a second ten-bit element syndrome value $S_2$, and a third ten-bit syndrome value $S_3$; converting the syndrome values into a set of zero or more polynomial roots representing error locations in the receive message vector; and determining a bit index for each polynomial root in the set. The converting operation includes: deriving a number of errors from the syndrome values; and when the number of errors is two, using an array of logic gates to obtain two polynomial roots corresponding to a product of a syndrome value vector and a quadratic solution matrix, the quadratic solution matrix corresponding to a determination of a quadratic equation's trailing coefficient value s, a determination of the quadratic equation's roots, and a reversal of a variable substitution.

Another illustrative error correction method includes: obtaining syndrome values corresponding to a product of a receive message vector and a parity check matrix, the syndrome values including at least a first ten-bit syndrome value $S_1$, a second ten-bit element syndrome value $S_2$, and a third ten-bit syndrome value $S_3$; converting the syndrome values into a set of zero or more polynomial roots corresponding to error locations in the receive message vector; and determining a bit index for each polynomial root in the set. The converting includes: deriving a number of errors from the syndrome values; and when the number of errors is three, using a first lookup table with supporting logic gates to obtain three polynomial roots when $$\left(S_5 + S_1^5\right) = 0,$$

the three polynomial roots corresponding to roots of a cubic equation $x^3+d$ with d representable as $$S_3 + S_1^3,$$

the first lookup table having a depth of no more than 341.

Each of the foregoing embodiments may be implemented individually or in combination, and may be implemented with one or more of the following features in any suitable combination: 1. the reversal of the variable substitution is representable as $x=S_1 \cdot t$, and the trailing coefficient value is representable as $$s = \frac{S_3}{S_1^3} + 1.2.$$

the first array of logic gates and the second array of logic gates are each formed by a set of logical AND gates to implement bitwise multiplications and a set of logical XOR gates to implement bitwise additions. 3. the syndrome values include an error parity value P. 4. the error corrector is configured to accumulate a parity delta of the parity check matrix based on the bit indexes and configured to invert receive message vector bits corresponding to the bit indexes if the parity delta indicates the bit errors are correctable. 5. the location finder further includes a first lookup table with supporting logic gates to obtain three polynomial roots when the number of errors is three and $$(S_5 + S_1^5) = 0,$$

the three polynomial roots corresponding to roots of a cubic equation $x^3 + d$ with d representable as $$S_3 + S_1^3,$$

and the first lookup table having a depth of no more than 341. 6. the first lookup table contains a single polynomial root or error location and the supporting logic gates derive remaining polynomial roots or error locations from the single polynomial root or error location. 7. the location finder further includes a second lookup table with supporting logic gates to obtain three polynomial roots when the number of errors is three and $$(S_5 + S_1^5) \neq 0,$$

the three polynomial roots corresponding to roots of a cubic equation $x^3 + x + d$ with d representable as $$\left\{ \frac{(s_3 + s_1^3)^5}{(s_5 + s_1^5)^3} \right\}^{1/2},$$

and the first lookup table having a depth of no more than 170. 8. the second lookup table contains two polynomial roots or error locations and the supporting logic gates for the second lookup table derive a remaining polynomial root or error location from the two polynomial roots or error locations contained in the second lookup table. 9. the location finder is configured to provide syndrome value $S_1$ as a polynomial root when the number of errors is one. 10. the receive message vector contains exactly 1022 bits and the parity check matrix $H_{comp}$ has 32×1022 binary elements representing powers of a primitive polynomial root in a composite field $GF((2^5)^2)$. 11. deriving the number of errors includes: determining that the number of errors is zero if the syndrome values are all zero; determining that the number of errors is one if syndrome value $S_1$ is nonzero and remaining syndrome values are all zero; determining that the number of errors is two if $$(S_5 + S_1^5)S_1 = (S_3 + S_1^3)S_3;$$

and otherwise determining that the number of errors is three. 12. the method include verifying that roots exist for the quadratic equation if the number of roots is two by determining that a binary representation of trailing coefficient s has a bit $s_7 = 0$.

BRIEF DESCRIPTION OF THE DRAWINGS

FIG. 1 is a perspective view of an illustrative active Ethernet cable.

FIG. 2 is a function-block diagram of an illustrative AEC.

DETAILED DESCRIPTION

Figure 3:
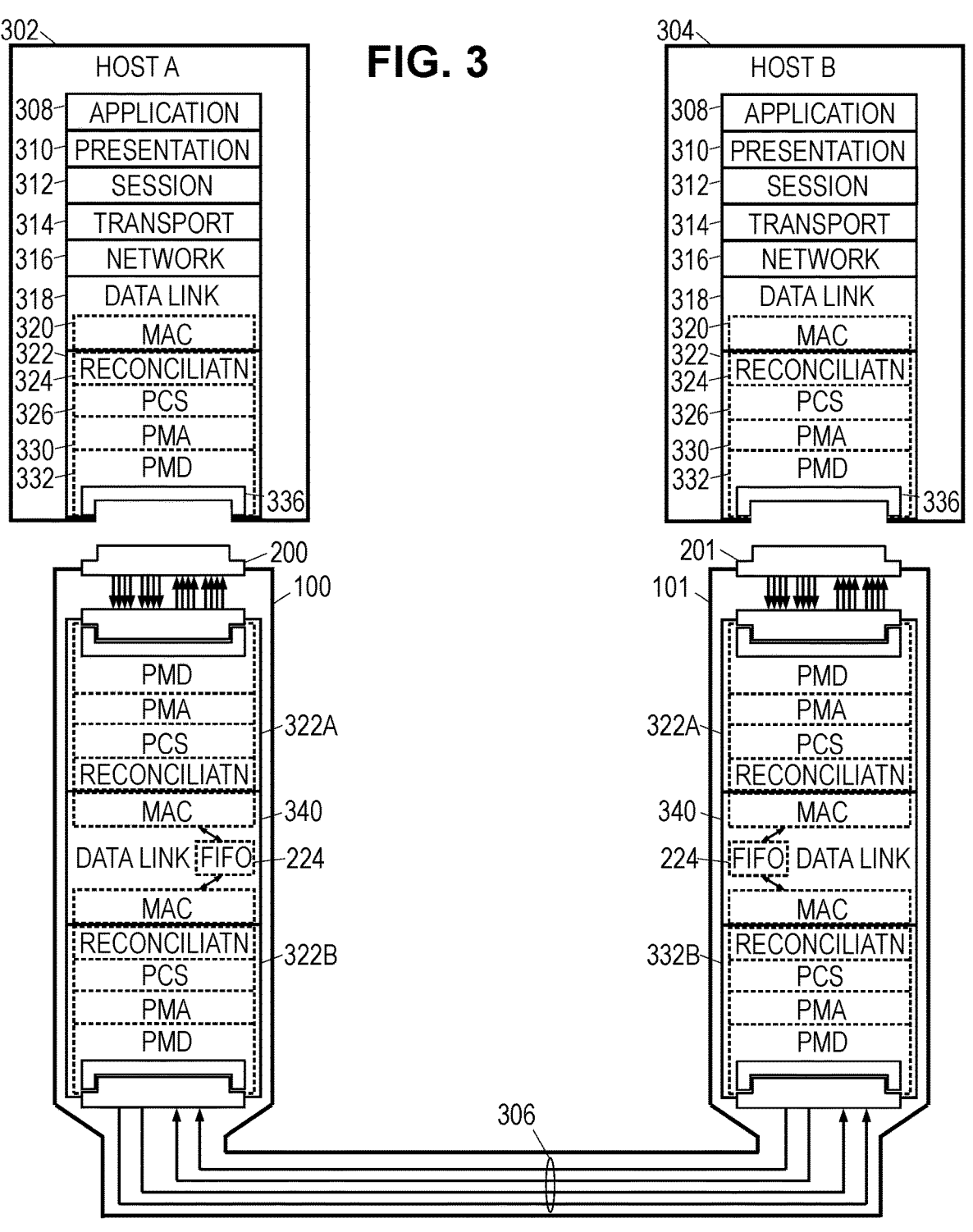
FIG. 3 is an architectural diagram for a communications link including the illustrative cable.

While specific embodiments are given in the drawings and the following description, keep in mind that they do not limit the disclosure. On the contrary, they provide the foundation for one of ordinary skill to discern the alternative forms, equivalents, and modifications that are encompassed in the scope of the appended claims.

To provide an illustrative context for understanding the myriad applications of the disclosed decoders, FIG. 1 is a perspective view of an illustrative 400 Gbps cable that may be used to provide a high-bandwidth communications link between devices in a routing network such as that used for data centers, server farms, and interconnection exchanges. The routing network may be part of, or may include, for example, the Internet, a wide area network, or a local area network. The linked devices may be computers, switches, routers, and the like. The cable includes a first connector 100 and a second connector 101 that are connected via one or more optical fibers in a cord 106. The one or more optical fibers may each be configured for unidirectional or bidirectional communication of wave division multiplexed optical signals.

To enable robust performance over even extended cable lengths, each connector 100, 101 may include a powered transceiver that performs electrooptical signal conversion combined with clock and data recovery (CDR) and re-modulation of data streams in each direction. The powered transceivers are also known as data recovery and re-modulation (DRR) devices. In at least one contemplated embodiment, the cable connectors 100, 101 are quad small form-factor pluggable double density (QSFP-DD) transceiver modules that exchange 400GAUI-8 data streams with the host.

FIG. 2 is a function-block diagram of an illustrative cable of FIG. 1. Connector 100 includes a plug 200 adapted to fit a standard-compliant Ethernet port in a first host device 302 (see FIG. 3) to receive an electrical input signal carrying an outbound data stream from the host device and to provide an electrical output signal carrying an inbound data stream to the host device. Similarly, connector 101 includes a plug 201 that fits an Ethernet port of a second host device 304. Connector 100 includes a first DRR device 202 to perform CDR and re-modulation of the data streams entering and exiting the cable at connector 100, and connector 101 includes a second DRR device 204 to perform CDR and re-modulation of the data streams entering and exiting the cable at connector 101. Optical transceiver chips 240, 242 provide conversion between electrical and optical signals to convey the data streams across the optical fibers 107 coupled between the connectors 100, 101. The DRR devices 202, 204 may be integrated circuits mounted on a printed circuit board and connected to edge connector contacts and to optical transceivers 240, 242 via circuit board traces. Optical couplers attached to the transceivers 240, 242 may connect the transceivers to the optical fibers 107.

In at least some contemplated embodiments, the printed circuit boards each also support a micro-controller unit (MCU) 206. Each DRR device 202, 204 is coupled to a respective MCU device 206 which configures the operation of the DRR device via a first two-wire bus. At power-on, the MCU device 206 loads equalization parameters and/or other operating parameters from Flash memory 207 into the DRR device's configuration registers 208. The host device can access the MCU device 206 via a second two-wire bus that operates in accordance with the I2C bus protocol and/or the faster MDIO protocol. With this access to the MCU device 206, the host device can adjust the cable's operating parameters and monitor the cable's performance.

Each DRR device 202, 204, includes a set 220 of transmitters and receivers for communicating with the host device and a set 222 of transmitters and receivers for communications via the optical transceivers and intervening optical fibers. The illustrated host-facing transceivers 220 support eight lanes (400GAUI-8) for bidirectional communication with the host device. In other contemplated embodiments, the host-facing transceivers 220 support other data rates and lane configurations. The DRR devices include a memory 224 to provide first-in first-out (FIFO) buffering between the transmitter & receiver sets 220, 222. An embedded controller 228 coordinates the operation of the transmitters and receivers by, e.g., setting initial equalization parameters and ensuring the training phase is complete across all lanes and links before enabling the transmitters and receiver to enter the data transfer phase. The embedded controller 228 employs a set of registers 208 to receive commands and parameter values, and to provide responses potentially including status information and performance data.

The illustrative cable of FIG. 2 may be a part of a point-to-point communications link between two host devices 302, 304 as shown in the architectural diagram of FIG. 3. FIG. 3 shows the architecture using the ISO/IEC Model for Open Systems Interconnection (See ISO/IEC 7498-1:1994.1) for communications via channels 306 over a physical medium such as optical fibers. The interconnection reference model employs a hierarchy of layers with defined functions and interfaces to facilitate the design and implementation of compatible systems by different teams or vendors. While it is not a requirement, it is expected that the higher layers in the hierarchy will be implemented primarily by software or firmware operating on programmable processors while the lower layers may be implemented using micro-code and/or application-specific hardware.

The Application Layer 308 is the uppermost layer in the model, and it represents the user applications or other software operating on different systems that need a facility for communicating messages or data. The Presentation Layer 310 provides such applications with a set of application programming interfaces (APIs) that provide formal syntax along with services for data transformations (e.g., compression), establishing communication sessions, connectionless communication mode, and negotiation to enable the application software to identify the available service options and select therefrom. The Session Layer 312 provides services for coordinating data exchange including: session synchronization, token management, full-or half-duplex mode implementation, and establishing, managing, and releasing a session connection. In connectionless mode, the Session Layer may merely map between session addresses and transport addresses.

The Transport Layer 314 provides services for multiplexing, end-to-end sequence control, error detection, segmenting, blocking, concatenation, flow control on individual connections (including suspend/resume), and implementing end-to-end service quality specifications. The focus of the Transport Layer 314 is end-to-end performance/behavior. The Network Layer 316 provides a routing service, determining the links used to make the end-to-end connection and when necessary acting as a relay service to couple together such links. The Data link layer 318 serves as the interface to physical connections, providing delimiting, synchronization, and sequence and flow control across the physical connection. It may also detect and optionally correct errors that occur across the physical connection. The Physical layer 322 provides the mechanical, electrical, functional, and procedural means to activate, maintain, and deactivate channels 306, and to use the channels 306 for transmission of bits across the physical media.

The Data Link Layer 318 and Physical Layer 322 are subdivided and modified slightly by IEEE Std 802.3-2015, which provides a Media Access Control (MAC) Sublayer 320 in the Data Link Layer 318 to define the interface with the Physical Layer 322, including a frame structure and transfer syntax. Within the Physical Layer 322, the standard provides a variety of possible subdivisions such as the one illustrated in FIG. 3, which includes an optional Reconciliation Sublayer 324, a Physical Coding Sublayer (PCS) 326, a Forward Error Correction (FEC) Sublayer 328, a Physical Media Attachment (PMA) Sublayer 330, and a Physical Medium Dependent (PMD) Sublayer 332.

The optional Reconciliation Sublayer 324 merely maps between interfaces defined for the MAC Sublayer 320 and the PCS Sublayer 326. The PCS Sublayer 326 provides alignment marker insertion/removal, FEC, and framing with synchronization and training sequences. The PMA Sublayer 330 provides symbol encoding/decoding, filtering, conversion between analog and digital signal formats. The PMD Sublayer 332B specifies the optical transceiver conversions between transmitted/received channel signals and the corresponding electrical signals. A receptacle 336 is also shown as part of the PMD sublayer 332 to represent the physical network interface port.

The connectors 100, 101, have plugs 200, 201 representing edge connectors that mate with the receptacles 336 of the two host devices 302, 304. Within each connector, the DRR devices may implement a host-facing Physical Layer 322A, a center-facing Physical Layer 322B, and a Data Link Layer 340 that bridges together the two Physical Layers. In some embodiments, one or more of the internal sublayers within each connector (e.g., PCS, Reconciliation, MAC) are bypassed or omitted entirely to reduce areal requirements and/or to reduce power. More information regarding the operation of the sublayers, as well as the electrical and physical specifications of the connections between the nodes and the communications medium (e.g., pin layouts, line impedances, signal voltages & timing), and the physical specifications for the communications medium itself (e.g., limitations on attenuation, dispersion), can in many cases be found in the current standard, and any such details should be considered to be well within the knowledge of those having ordinary skill in the art.

Figure 4:
FIG. 4 is a block diagram of an illustrative transmit chain and its corresponding receive chain.

FIG. 4 provides a more detailed block diagram of illustrative transmit and receive chains in the PCS sublayer. The PCS sublayer transmit chain in FIG. 4 accepts a 400GMII PCS data stream. Pursuant to the standard, the PCS data stream is already encoded with a transmission code that provides DC balance and enables timing recovery. A transcoder module 402 modifies the transmission code from a 64b/66b code to a 256b/257b code more appropriate for use with the FEC strategy. The receive chain includes a reverse transcoder module 403 to reverse this operation.

Generic mapping procedure (GMP) modules 404, 405 each provide a transition between the local system clock domain and the line clock domain, typically providing word padding to accommodate mismatches in clock rates. An alignment marker insertion module 406 provides alignment markers that enable alignment between different lanes of the data stream. Detector module 407 detects and removes the alignment markers. Note that these modules may cooperate with alignment marker insertion/removal modules in other sublayers to preserve alignment marker content across the transcoding process.

A Cyclic Redundancy Check calculation module 408 adds checksum information to the data stream, which is verified on the receiving side by a check module 409 to detect data corruption. An error decorrelation interleaver module 410 redistributes symbols of the data stream, an operation that is reversed by de-interleaver module 411 on the receive side. Staircase encoder module 412 implements a staircase code having BCH component codes. Staircase decoder module 413 reverses this operation as described further below.

Module 414 appends pad bits to align the staircase code words with 400ZR frame boundaries of 400ZR, and applies a predefined scrambling mask. Module 415 reverses these operations on the receive side. A convolutional interleaver 416 disperses bits from the code words to increase resilience to burst errors. De-interleaver module 417 reverses this operation on the receive side.

Hamming encoder module 418 applies an double-extended Hamming Code SD-FEC (128,119) to provide additional net coding gain. Module 419 performs the decoding operation on the receive side. Symbol mapper module 420 maps the coded data stream eight bits at a time to dual polarization 16-point quadrature amplitude modulation (DP-16QAM) symbols, which are then time interleaved by symbol interleaver module 422. The receive chain includes corresponding modules 421, 423 to reverse these operations.

To aid with timing synchronization and clock recovery, module 424 provides a frame alignment word (FAW) at the beginning of each super-frame, which includes 49 sub-frames each having a training sequence provided by module 424. Module 424 further inserts a pilot symbol every 32 symbols. In the receive chain, module 425 uses the FAW to detect the alignment of super-frames before removing the pilot symbols, training sequences, and FAWs.

Modules 426, 427 represent the PMA sublayer, in which digital signal processing may be performed for spectrum shaping and signal equalization and conversion between digital and analog signal domains. On the receive side, module 427 performs clock recovery as part of the analog-to-digital conversion. Modules 428, 429 represent the PMD sublayer, in which the optical transceivers convert electrical transmit signals to optical signals in the fiber and convert received optical signals to electrical receive signals on the receive side.

Figure 5:
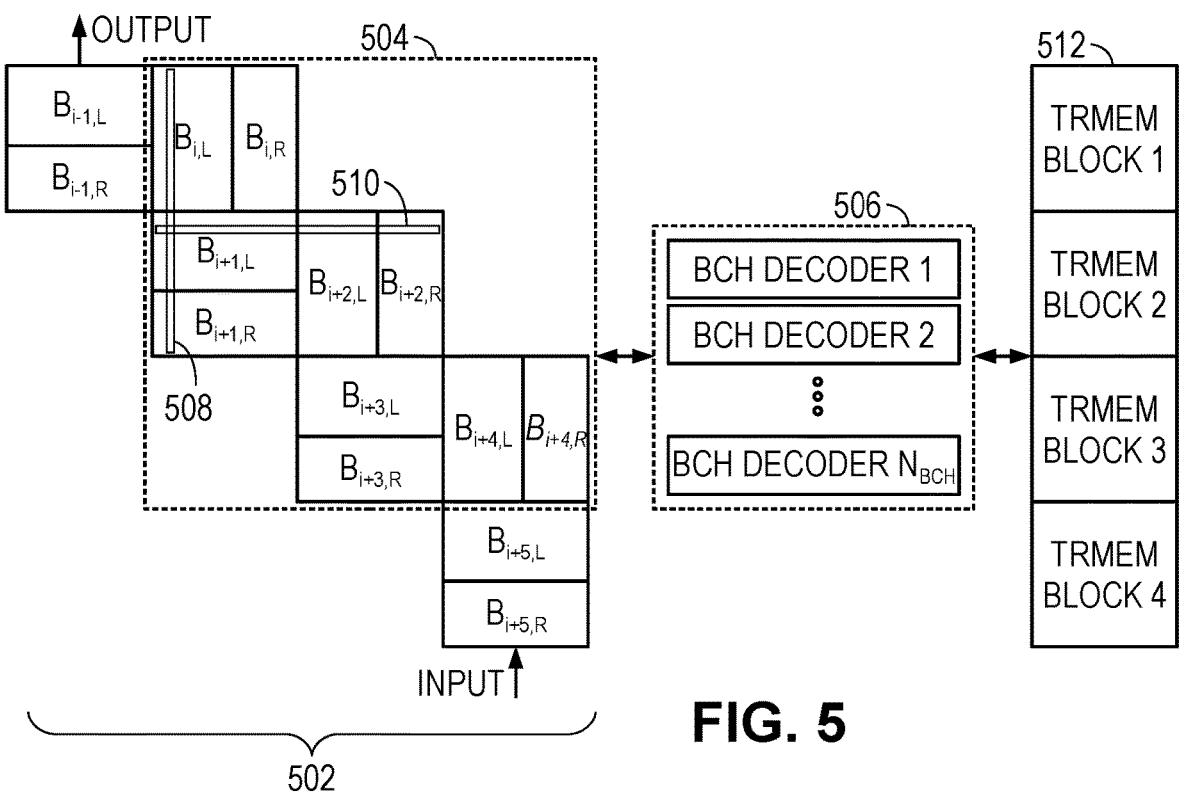
FIG. 5 is a block diagram of an illustrative staircase code decoder.

The operation of decoder module 413 is illustrated by the block diagram in FIG. 5. A memory 502 receives an encoded input stream conceptually organized as a stairstep arrangement of blocks Bi within a decoding window 504. Each block has a left side having data bits and a right side having parity bits for code words 508, 510 that extend across the data bits and across the preceding data block. A parallel set of BCH decoders 506 alternately operate on vertical code words 508 and horizontal code words 510, iterating forward and backward through the blocks in the decoding window 504. In theory the iteration may be repeated until no further error corrections are made. In practice, a predetermined number of iterations are performed before the decoding window 504 is shifted.

Memory 502 may be organized as bytes or words, causing the memory locations to be accessed in an easy-to-read fashion during initial processing of the block but to be accessed in a more distributed fashion during the subsequent processing of that block. To facilitate subsequent processing, the decoders 506 may form transpositions of each block during the initial processing, storing the transposed blocks in set of transpose memory blocks 512. Further implementation details can be found in the literature, including, e.g., D. Truhachev et al., "Efficient Implementation of 400 Gbps Optical Communication FEC", IEEE Trans. Circuits & Systems-I, V68n1, Jan. 2021.

It is desirable for each of the BCH decoders 506 to be implemented as efficiently as possible to facilitate high throughput with minimal power consumption.

Figure 6:
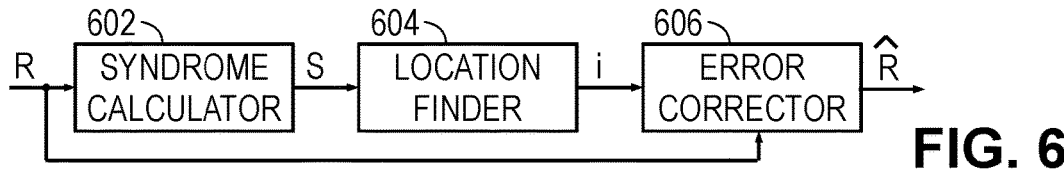
FIG. 6 is a block diagram of an illustrative BCH decoder.

FIG. 6 is a block diagram of an illustrative BCH decoder which is conceptually implemented in three parts. A syndrome calculator 602 operates on the received message R to obtain syndrome values S. From these syndrome values, a location finder 604 determines the number of errors and the location i of each error (or determines that the number of errors exceeds the correction capability of the code). Using the error locations, an error corrector 606 modifies the received message R to produce a corrected message $\hat{R}$.

Conventional implementations of the location finder 604 employ iterative procedures for calculating and factoring the error location polynomial, e.g., Berlekamp-Massey algorithm with a Chien search. It is challenging to accommodate such iteration when decoding high bandwidth data streams. The enhanced decoding method disclosed below may offer at least four potential advantages over existing decoder implementations: (1) the properties of the trace function are exploited for a fast, non-LUT based, determination whether the error polynomial has any roots; (2) the error polynomial factorization operations are simplified through the use of a composite field; (3) the basis conversion to the composite field is precomputed and thus incurs no overhead; and (4) the LUT for finding the cubic roots is made much smaller.

Figure 8:
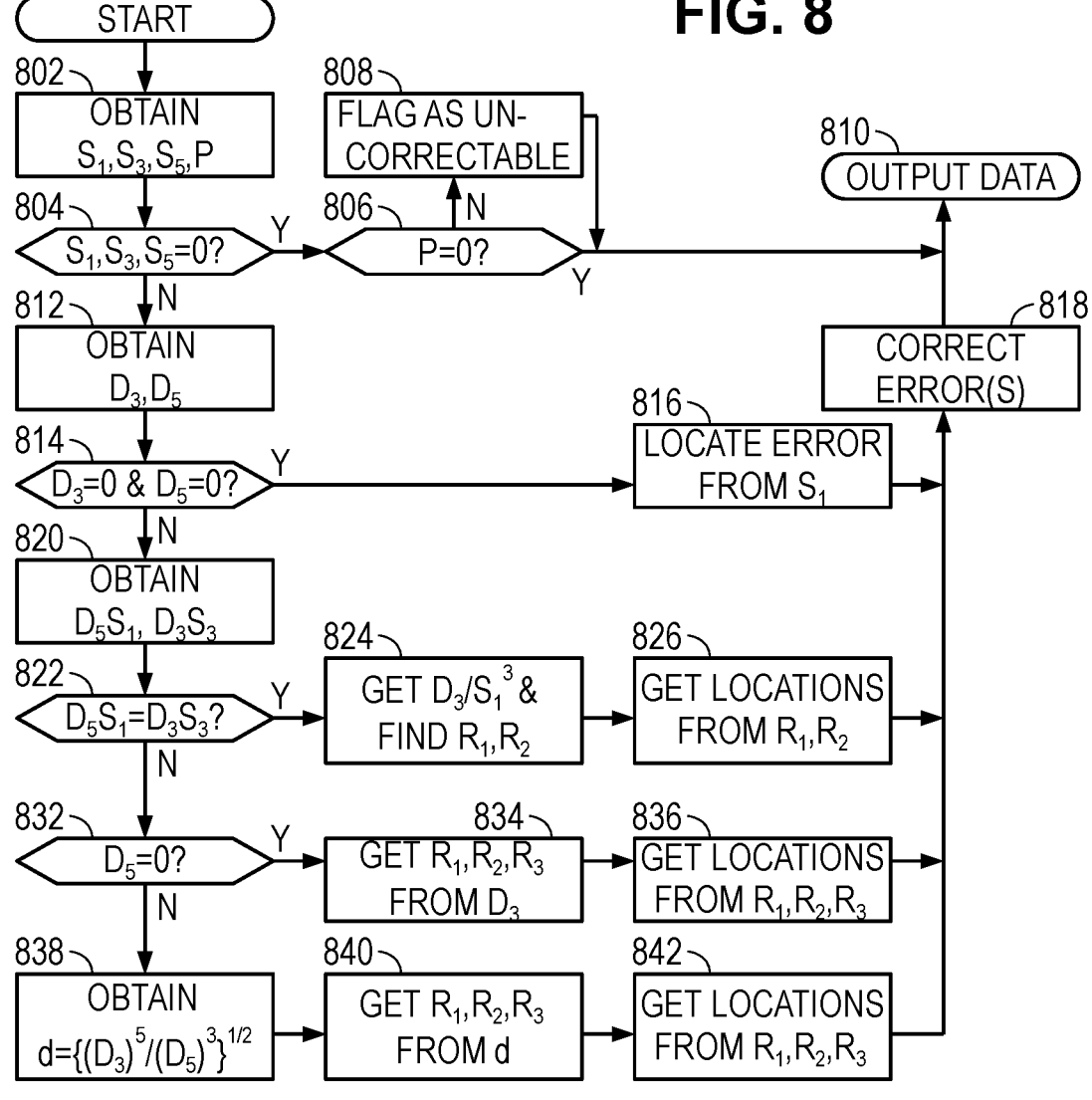
FIG. 8 is a flow diagram of an illustrative BCH decoding method.

Before describing the enhanced decoding method and decoder of FIG. 8, we explain the BCH code provided in the standard and the algebraic techniques by which the enhanced decoding method is derived. These techniques are applicable to all BCH and RS codes, and particularly suited to such codes having a low correction power, e.g., $d<4$ or $t<9$.

The underlying field of the (1022, 990) extended BCH code used in the ITU-T G.709.2/Y.1331.2 standard, is $GF(2^{10})$, which can be constructed by the primitive polynomial $p(x)=x^{10}+x^3+1$. Let $\alpha$ be the root of the primitive polynomial $p(x)$. The non-zero field elements of $GF(2^{10})$ can be represented as $\alpha^i$, $0 \le i \le 1022$, which we refer to as the "power" representation, where $\alpha^{1023}=\alpha^0=1$. A consequence of the field's construction is that its elements can be expressed as a weighted sum of the first ten powers, i.e., we can write $\alpha^i = b_9\alpha^9 + b_8\alpha^8 + \ldots + b_0$, $0 \le i \le 1022$, where the coefficients are binary. For indexing convenience, we refer to the integer $l = b_9 2^9 + b_8 2^8 + \ldots + b_0$ as the "binary" representation of $\alpha^i$. We define $\log(l) = i$.

BCH encoding is accomplished using a generator matrix defined in terms of these field elements. To enable systematic encoding (where the code words include the original data word concatenated with a set of parity symbols), the generator matrix columns may be permuted to make a portion of the generator matrix resemble an identity matrix. The standard achieves this result by defining a permutation function $\Pi_d$ on the integers $i, 0 \le i \le 509$. In the following, $\Pi_d(M:M+N) = K:K+N$ is a shorthand for $\Pi_d(M) = K, \Pi_d(M+1) = K+1, \ldots, \Pi_d(M+N) = K+N$. Values of $\Pi_d$ are specified via the following Table 1.

TABLE 1

Values of $\Pi_d$

| | | |
|---|---|---|
| $\Pi_d(0:7) = 478{:}485$ | $\Pi_d(8) = 0$ | $\Pi_d(9{:}11) = 486{:}488$ |
| $\Pi_d(12) = 1$ | $\Pi_d(13) = 489$ | $\Pi_d(14{:}16) = 2{:}4$ |
| $\Pi_d(17{:}19) = 490{:}492$ | $\Pi_d(20) = 5$ | $\Pi_d(21) = 493$ |
| $\Pi_d(22{:}24) = 6{:}8$ | $\Pi_d(25) = 494$ | $\Pi_d(26{:}32) = 9{:}15$ |
| $\Pi_d(33{:}35) = 495{:}497$ | $\Pi_d(36) = 16$ | $\Pi_d(37) = 498$ |
| $\Pi_d(38{:}40) = 17{:}19$ | $\Pi_d(41) = 499$ | $\Pi_d(42{:}48) = 20{:}26$ |
| $\Pi_d(49) = 500$ | $\Pi_d(50{:}64) = 27{:}41$ | $\Pi_d(65{:}67) = 501{:}503$ |
| $\Pi_d(68) = 42$ | $\Pi_d(69) = 504$ | $\Pi_d(70{:}72) = 43{:}45$ |
| $\Pi_d(73) = 505$ | $\Pi_d(74{:}80) = 46{:}52$ | $\Pi_d(81) = 506$ |
| $\Pi_d(82{:}128) = 53{:}99$ | $\Pi_d(129) = 507$ | $\Pi_d(130) = 100$ |
| $\Pi_d(131) = 508$ | $\Pi_d(132{:}256) = 101{:}225$ | $\Pi_d(257) = 509$ |
| $\Pi_d(258{:}509) = 226{:}477$ | | |

Consider the function f(i) which maps an integer $i, 1 \le i \le 1023$, to the column vector $$f(i) = \begin{bmatrix} \beta_i \\ \beta_i^3 \\ \beta_i^5 \\ F(\beta_i) \\ \overline{F(\beta_i)} \end{bmatrix}$$

where $\beta_i = \alpha^{\log(i)}$, and $$f(i) = \begin{bmatrix} \beta_i \\ \beta_i^3 \\ \beta_i^5 \\ F(\beta_i) \\ \overline{F(\beta_i)} \end{bmatrix}$$

for $l$ the binary representation of $\beta_i$, and $\overline{x}$ is the complementation of x. Then the generator matrix can be obtained in the following way. First assemble the column vectors as:

$$H = \left[ f(1021)f(1022)f(1) \ldots f(510)f(511 + \Pi^{-1}(0)) \ldots f(511 + \Pi^{-1}(509)) \right]$$

Then replace each element in the first three rows of H by its corresponding 10-bit binary representation l and perform elementary row operations (over GF(2)) on H to obtain its row-reduced echelon form with the identity matrix on the right $H_{ENC} = [P^T; I]$. The generator matrix is then G=[I; P], where the resulting 990×32 matrix P provides the encoder's parity-generating matrix.

The encoder may be implemented as a multiplication of a 1×990 vector (the 990-bit message) by a 990×1022 matrix (the generator matrix). The matrix element multiplications and additions are performed over GF(2), where AND gate and XOR gates respectively correspond to multipliers and adders. The encoder can thus be implemented as an AND-XOR gate array.

The multiplicative inversion of $GF(2^{10})$ via a polynomial basis constructed via $p(x) = x^{10} + x^3 + 1$ is complicated. If it is implemented via a look up table (LUT), the depth of LUT will be 1023 such that the critical path can be deteriorated. However, $GF(2^{10})$ is isomorphic to the composite field $GF((2^5)^2)$, enabling us to exploit the composite field to simplify the multiplicative inversion. Additionally, the composite field simplifies the solving of quadratic equations, since operations in the composite field $GF((2^5)^2)$ can be decomposed to several operations in the sub-field $GF(2^5)$.

To use composite field in the (1022, 990) extended BCH encoder/decoder of the ITU-T standard, we must consider basis conversion. We note that the generating polynomial of (1022, 990) BCH code can be the same for both $GF(2^{10})$ in polynomial basis constructed via $p(x) = x^{10} + x^3 + 1$ and the composite field, because the minimal polynomial of $\alpha$, $\alpha^3$, $\alpha^5$ can be the same, i.e., it doesn't depend on what underlying fields are chosen.

Hence, (1022, 990) BCH encoding with composite field representation is the same as the one with polynomial representation defined in ITU-T standard. For decoder, however, we don't use H matrix defined in the standard directly. Rather, we convert H matrix to $H_{com}$ in composite field. The conversion can be performed as follows:

The last two rows of $H_{com}$ are the same as the ones in H.

Each column in H excluding the last two rows can be treated as 3 field elements in $GF(2^{10})$, namely $$\beta_i, \beta_i^3, \text{ and } \beta_i^5$$

in polynomial basis representation. Convert $$\beta_i, \beta_i^3, \text{ and } \beta_i^5$$

to composite field representation for $H_{com}$.

The conversion between H and $H_{com}$ is pre-computed, i.e., no extra hardware cost is needed. The decoding, including syndrome calculation, error location polynomial finding, and error location polynomial factorization can be done over the composite field $GF((2^5)^2)$. Next, we will introduce the composite field construction.

Figure 7:
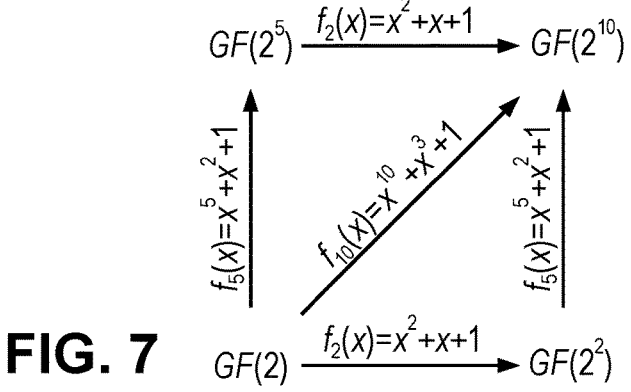
FIG. 7 shows the relationship of underlying fields to a composite field.

Let's first review the algebraic structure of a composite field $GF(2^{mn})$. $GF(2^{mn})$ can be constructed via an irreducible polynomial of degree m over $GF(2^n)$, where $GF(2^n)$ is called the ground field which in turn can be constructed via an irreducible polynomial of degree of n over GF(2). When $\gcd(m,n) = 1$, we can use two irreducible polynomials over GF(2) to construct the composite field. For $GF((2^5)^2)$, we can choose $f_5(x) = x^5 + x^2 + 1$ to construct the sub-field $GF(2^5)$ over GF(2) and $f_2(x) = x^2 + x + 1$ to construct $GF((2^5)^2)$ over $GF(2^5)$. FIG. 7 shows the relationships between the various fields.

Though it is not the case here, we note that if n is 2 and m is an even number, we can't use the irreducible polynomial $f_2(x) = x^2 + x + 1$ to construct $GF((2^m)^2)$ over $GF(2^m)$. Instead, we could find an irreducible polynomial in the form $f_2(x)=x^2+x+\theta^i$, where $\theta$ is the primitive element in $GF(2^m)$, by computing the trace value of $Tr(\theta^i)$ for various values of i. If $Tr(\theta^i)=1$, $f_2(x)=x^2+x+\theta^i$ is irreducible over $GF(2^m)$, otherwise it is reducible. We can choose the irreducible polynomial with the lowest Hamming weight value of $\theta^i$ to construct $GF((2^m)^2)$ over $GF(2^m)$.

Because we are contemplating performing our operations over $GF(2^5)$, we note the existence of efficient solutions for performing generic multiplication of low Hamming weight polynomials, such as trinomials or pentanomials, over $GF(2^n)$. The System Verilog function is:

```
// N: polynomial degree
// k1,k2,k3: For pentanomial f(x) = x^n + x^k1 + x^k2 + x^k3 + 1
//      For trinomial f(x) = x^n + x^k1 +1,k2 and k3 are zeros
function logic [N−1:0] gf2n_mul;
    input logic [N−1:0] a;
    input logic [N−1:0] b;
    logic [2*N−2:0] c;
    c = '0;
    // polynomial multiplication
    for (int ix=0;ix<N;ix++)
        for (int jx=0;jx<N;jx++)
        c[ix+jx] = c[ix+jx] ^ (a[ix] & b[jx]);
    // reduction
    for (int ix=2*N−2;ix>=N;ix−−) begin
        c[ix−N] = c[ix−N] ^ c[ix];
        c[ix−N+k1] = c[ix−N+k1] ^ c[ix]; // for both trinomial and
        pentanomial
        if (k2!=0 && k3!=0) begin      // for pentanomial only
            c[ix−N+k2] = c[ix−N+k2] ^ c[ix];
            c[ix−N+k3] = c[ix−N+k3] ^ c[ix];
        end
    end
    return c[N−1:0];
endfunction
```

Accordingly, multiplication of such polynomials in $GF(2^5)$ can be implemented via an arrangement of logical AND ("&") and logical OR ("^") gates pursuant to the above method with N=5.

Now we introduce multiplication in the composite field multiplication. Let $\beta$ be the root of an irreducible polynomial $f_2(x)=x^2+x+1$, i.e., $\beta^2=\beta+1$. Let a,b,c $\in GF((2^5)^2)$, c=a·b, where $a=a_1\beta+a_0$, $b=b_1\beta+b_0$, $c=c_1\beta+c_0$, and $a_0$, $a_1$, $b_0$, $b_1$, $c_0$, and $c_1 \in GF(2^5)$. We can derive the formula for computing coefficients $c_0$ and $c_1$:

$$c = c_1\beta + c_0 = (a_1\beta + a_0)(b_1\beta + b_0) = a_1b_1\beta^2 + (a_0b_1 + a_1b_0)\beta + a_0b_0 \quad (1)$$

$$c = (a_1b_1 + a_0b_1 + a_1b_0)\beta + (a_1b_1 + a_0b_0)$$

By Karatsuba's method, $$c = ((a_0 + a_1)(b_0 + b_1) + a_0b_0)\beta + (a_1b_1 + a_0b_0), \quad (2)$$

$$c_1 = (a_0 + a_1)(b_0 + b_1) + a_0b_0,$$

$$c_0 = a_1b_1 + a_0b_0$$

For $GF(2^n)$ with a polynomial basis representation, we can use the following formula to compute the square of a field element. Let $a \in GF(2^n)$, and $$a = \sum_{i=0}^{n-1} a_i\alpha^i,$$

where $a_i \in GF(2)$, and $\alpha$ is the polynomial basis generator of $GF(2^n)$.

$$c = a^2 = \sum_{i=0}^{n-1} a_i \alpha^{2i}$$

Next, we use the field generating polynomial to perform reduction. For $GF(2^5)$ constructed via $f_5(x)=x^5+x^2+1$. Let $a=a_4\alpha^4+a_3\alpha^3+a_2\alpha^2+a_1\alpha+a_0$, and $c=a^2=a_4\alpha^8+a_3\alpha^6+a_2\alpha^4+a_1\alpha^2+a_0$. By $\alpha^8=\alpha^5\cdot\alpha^3=(\alpha^2+1)\cdot\alpha^3=\alpha^3+\alpha^2+1$ and $\alpha^6=\alpha^3+\alpha$, we have, $$c = a_2\alpha^4 + (a_4 + a_3)\alpha^3 + (a_4 + a_1)\alpha^2 + a_3\alpha + (a_4 + a_0)$$

For the square of a composite field element, $$c = c_1\beta + c_0 = a^2 = (a_1\beta + a_0)^2 = a_1^2\beta + (a_0^2 + a_1^2) \quad (3)$$

where $$c, a \in GF((2^5)^2),$$

and $$c_0, c_1, a_0,$$

and $$a_1 \in GF(2^5).$$

Turning now to square root operations in the composite field, we first review the algorithm for computing the square root of a non-zero element in $GF(2^5)$. Let $a,c \in GF(2^5)$ and $c=a^2$. We use the vector form $[a_0, a_1, a_2, a_3, a_4]$ and $[c_0, c_1, c_2, c_3, c_4]$ to represent a and c, where $a_0 \sim a_4$ and $c_0 \sim c_4 \in GF(2)$. The square in $GF(2^5)$ can be treated as a 1×5 vector multiplied by a 5×5 matrix, i.e., $[c_0, c_1, c_2, c_3, c_4]=[a_0, a_1, a_2, a_3, a_4]\cdot A$, where $$A = \begin{bmatrix} 1 & 0 & 0 & 0 & 0 \\ 0 & 0 & 1 & 0 & 0 \\ 0 & 0 & 0 & 0 & 1 \\ 0 & 1 & 0 & 1 & 0 \\ 1 & 0 & 1 & 1 & 0 \end{bmatrix}.$$

Any element has only one square root, i.e., matrix A is invertible to $$A^{-1} = \begin{bmatrix} 1 & 0 & 0 & 0 & 0 \\ 1 & 1 & 0 & 1 & 1 \\ 0 & 1 & 0 & 0 & 0 \\ 1 & 1 & 0 & 0 & 1 \\ 0 & 0 & 1 & 0 & 0 \end{bmatrix},$$

by which we have $$[a_0, a_1, a_2, a_3, a_4] = [c_0, c_1, c_2, c_3, c_4] \cdot A^{-1}$$

Now let's derive the formula for computing the square root of a non-zero element in $GF((2^5)^2)$. By Equation 3, we have:

$$a_1 = \sqrt{c_1}, \, a_0 = \sqrt{c_0 + c_1} \qquad (4)$$

where $$c_0, c_1, a_0,$$

and $$a_1 \in GF(2^5).$$

We turn now to showing how to perform multiplicative inversion in the composite field. In $GF(2^n)$, any non-zero field element can be represented as the power of the $$a = \alpha^i. \text{ By } \alpha^{2^n-1} = 1, a^{-1} = \alpha^{2^n-1-i}.$$

primitive element, namely A 31-depth LUT can be used to implement the multiplicative inversion in $GF(2^5)$. For multiplicative inversion in the composite field $GF((2^5)^2)$, let a, $b \in GF((2^5)^2)$, $a = a_1\beta + a_0$, $b = b_1\beta + b_0$, where $a_0$, $a_1$, $b_0$, and $b_1 \in GF(2^5)$. $a_0$ and $a_1$ can't be both zeros. By $a \cdot b = 1$, we can get two linear equations for $b_0$ and $b_1$:

$$a_1 b_0 + (a_0 + a_1)b_1 = 0 \qquad (5)$$

$$a_0 b_0 + a_1 b_1 = 1 \qquad (6)$$

By solving Equations 5 & 6, we have:

$$b_0 = \left(a_0^2 + a_0 a_1 + a_1^2\right)^{-1} \cdot (a_0 + a_1) \qquad (7)$$

$$b_1 = \left(a_0^2 + a_0 a_1 + a_1^2\right)^{-1} \cdot a_1 \qquad (8)$$

Thus, composite field $GF((2^5)^2)$ inversion can be implemented via a set of $GF(2^5)$ multipliers, squarers, and one $GF(2^5)$ inverter (which can be implemented via 31-depth LUT).

With the foregoing groundwork done, we can efficiently determine the error location polynomial. And rather than relying on the Chien search algorithm to factor the polynomial, which would impose a latency proportional to the code size, we note that the correction power of the (1022, 990) extended BCH code is 3, limiting the degree of the error location polynomial to three. Fast factorization can be achieved by solving the cubic, quadratic, or linear polynomial equations in the composite field.

We start with solving quadratic equations. The equation $x^2 = a$, where $a \in GF(2^n)$, always has a double root in $a \in GF(2^n)$. For a receive message having two errors, the error locator polynomial will take the form $x^2 + ax + b = 0$, where $a, b \in GF(2^n)$, $a \neq 0$. This form can be converted to the following equation by replacing $x = a \cdot t$ $$t^2 + t + \frac{b}{a^2} = 0 \qquad (9)$$

Let $$s = \frac{b}{a^2}.$$

Equation 9 has two roots, r and r+1, if and only if $Tr_{GF(2^n)|GF(2)}(s) = 0$, where $Tr_{GF(2^n)|GF(2)}(s)$ is the trace function mapping s from $GF(2^n)$ to $GF(2)$ as follows:

$$Tr_{GF(2^n)|GF(2)}(s) = \sum_{i=0}^{n-1} s^{2^i} \qquad (10)$$

Before showing how to solve Equation 9 in the composite field, we examine the solution in $GF(2^{10})$, which is constructed via $p(x) = x^{10} + x^3 + 1$. The $GF(2^{10})$ element s can be represented via the polynomial basis $$\{1, \alpha, \alpha^2, \dots, \alpha^9\} \text{ as } s = \sum_{i=0}^{9} s_i \alpha^i,$$

where $\alpha$ is the root of $p(x)$ and $s_i \in GF(2)$. It can be shown that $$Tr_{GF(2^{10})|GF(2)}(\alpha^i)$$

is zero for all $i \neq 7$, meaning that $$Tr_{GF(2^{10})|GF(2)}(s) = s_7. \qquad (11)$$

If there exist roots in $GF(2^{10})$ for the equation $x^2 + x + s = 0$, then $Tr_{GF(2^{10})|GF(2)}(s) = 0$. By applying the trace mapping on both sides of the equation (abbreviating $Tr_{GF(2^{10})|GF(2)}$ as Tr): $Tr(x^2 + x + s) = Tr(x^2) + Tr(x) + Tr(s) = s_7 = 0$, since $Tr(x^2) = Tr(x)$. For a $GF(2^{10})$ element in standard polynomial basis representation, we need only check the coefficient $s_7$ to determine whether the quadratic equation has roots in $GF(2^{10})$. (As an aside, we note that this technique is applicable to all binary fields $GF(2^n)$).

When the coefficient is zero, let $x_1$ be one root. Then the other root is $x_2 = x_1 + 1$. By the Hilbert constructive method:

$$x_1 = s\theta^2 + \left(s + s^2\right)\theta^{2^2} + \left(s + s^2 + s^{2^2}\right)\theta^{2^3} + \dots + \left(s + s^2 + \dots + s^{2^8}\right)\theta^{2^9} \qquad (12)$$

where $$\theta \in GF(2^{10}) \text{ and } Tr(\theta) = 1.$$

By choosing $\theta = \alpha^7$:

$$\qquad (13)$$

$$x_1 = s\alpha^{7\cdot2} + \left(s + s^2\right)\alpha^{7\cdot2^2} + \left(s + s^2 + s^{2^2}\right)\alpha^{7\cdot2^3} + \dots + \left(s + s^2 + \dots + s^{2^8}\right)\alpha^{7\cdot2^9}$$

The $\alpha^{7\cdot2^i}$ terms are constants that can be precomputed, the additions are bitwise XOR operations, and the squaring of the s can be performed by an XOR array in a fashion similar to the polynomial multiplication Verilog code above. These computations can be expressed as a multiplication of the coefficient vector s with a 10×10 matrix whose entries are GF(2) elements.

In the case where the underlying field is the composite field $GF((2^5)^2)$, $s \in GF((2^5)^2)$ and it can be represented as $s=s_1\beta+s_0$, where $s_0,s_1 \in GF(2^5)$. Representing one root as $c=c_1\beta+c_0$, we have the equation, $$c_1^2\beta^2 + c_0^2 + c_1\beta + c_0 = s_1\beta + s_0.$$

By replacing $\beta^2$ with $\beta+1$, $$c_1^2 + c_1 + s_1 = 0 \qquad (14)$$

$$c_0^2 + c_0 + c_1^2 + s_0 = 0 \qquad (15)$$

Equations 14 and 15 are quadratic equations in the subfield $GF(2^5)$, making them simpler to solve. Equation 14 either has two different roots in $GF(2^5)$ or it has no roots in $GF(2^5)$. If Equation 14 has no roots in $GF(2^5)$, there will be no roots in the composite field for Equation 9. Assuming the roots exist, one root is r and the other is r+1.

Replace $c_1$ in Equation 15 with r and r+1. One of $$Tr_{GF(2^5)|GF(2)}\left((r+1)^2 + s_0\right)$$

and $$Tr_{GF(2^5)|GF(2)}\left(r^2 + s_0\right)$$

is zero, and the other must be 1. Keep the root satisfying $$Tr_{GF(2^5)|GF(2)}\left(c_1^2 + s_0\right) = 0.$$

Given the selected root, we can also find two roots of $c_0$ for Equation 12 given the selected root of $c_1$.

A depth-31 LUT could be used to determine r, and hence r+1, for Equations 14 and 15, but a simpler method is available for solving the quadratic equation, $x^2+x+s=0$ in $GF(2^5)$ (the method is based on Hilbert's Theorem 90).

If the equation $x^2+x+s=0$ has roots in $GF(2^5)$, then $Tr(s)=0$. Proof: By applying trace mapping on both sides of the equation, $$Tr\left(x^2 + x + s\right) = Tr\left(x^2\right) + Tr(x) + Tr(s) = 0$$

By $Tr(x^2)=Tr(x)$, $Tr(s)=0$. Since $Tr(s)=0$ and $$Tr(s) = s + s^2 + s^{2^2} + s^{2^3} + s^{2^4}$$

in $GF(2^5)$, then $$r_1 = s^2 + s^{2^3}$$

is one root of the equation, and the other root is $$r_2 = s^2 + s^{2^3} + 1.$$

Using the groundwork above, the roots can be found using an arrangement of logic gates. We don't need any LUTs to solve $x^2+x+s=0$ in either $GF(2^5)$ and $GF((2^5)^2)$. Once these roots are found, the variable substitution for Equation 9 can be reversed to determine the roots of the quadratic error location polynomial. These computations can be expressed as a multiplication of the coefficient vector s with a 10×10 matrix whose entries are GF(2) elements.

Having chosen the irreducible polynomial $f_5(x)=x^5+x^2+1$ to construct $GF(2^5)$, the trace calculation to determine whether roots exist is easy. Let $\alpha$ be the root of $f_5(x)$. Then the field element, a can be represented via polynomial basis $$\{1, \alpha, \alpha^2, \alpha^3, \alpha^4\} \text{ as } a = \sum_{i=0}^{4} a_i\alpha^i.$$

As $Tr(\alpha)=Tr(\alpha^2)=Tr(\alpha^4)=0$ and $Tr(1)=Tr(\alpha^3)=1$, $Tr(a)=a_0+a_3$.

Turning now to factoring cubic equations in the composite field $GF((2^5)^2)$, we only need to consider two types of cubic equations: $x^3+d=0$, where $d\neq0$, and $x^3+x+d=0$. This simplification results from an ability to convert the general cubic equation, $x^3+ax^2+bx+c=0$, $a\neq0$, a, b, $c\in GF((2^5)^2)$, to these two types. The conversion is done by variable substitution, replacing x with t+a, yielding $t^3+(a^2+b)t+(ba+c)=0$.

If $a^2+b=0$, we have converted the general cubic equation to the first type. Otherwise, when $a^2+b+0$, replace t with sy, yielding $s^3y^3+(a^2+b)sy+(ba+c)=0$. Divide this by $s^3$ to get $$y^3 + \frac{a^2+b}{s^2}y + \frac{ba+c}{s^3} = 0.$$

Let $$s = \sqrt[2]{a^2+b},$$

such that $$d = \frac{ba+c}{\left(a^2+b\right)^{\frac{3}{2}}}.$$

Then we have the second cubic equation type with $y^3+y+d=0$.

For the first type, either we can find 3 different roots or no roots in $GF((2^5)^2)$. If we find a root r, the other two roots will be $r\beta$ and $r\beta^2$, where $\beta^2+3+1=0$, $(\beta^3=1)$. Let $r=r_1\beta+r_0$, then we have $$r\beta = r_1\beta^2 + r_0\beta = (r_0 + r_1)\beta + r_1 \qquad (16)$$

$$r\beta^2 = r_1\beta^2 + r_0\beta = (r_0 + r_1)\beta^2 + r_1\beta = r_0\beta + (r_0 + r_1) \qquad (17)$$

We can use LUT to save only one root, enabling the use of a LUT with a depth of only 341. The other two roots can be calculated via Equations 16 and 17 by an arrangement of logic gates. The logic gate arrangement can then reverse the variable substitution to provide the roots of the original cubic equation.

In $GF(2^5)^2$, for the second type of cubic equation, $x^3+x+d=0$:

> There are 512 values of d where the equation has only one root in $GF((2^5)^2)$,
>
> 170 values of d where the equation has 3 different roots,
>
> 341 values of d where the equation has no roots in $GF((2^5)^2)$, and
>
> for d=0, 1 is a double root and 0 is the third root.

In our case, the error locator polynomial is cubic only where errors exist in three different locations. Accordingly, we only care about the 170 values of d where the cubic equation has 3 different roots. The LUT would need to store only two roots for each of these values, as the third root is the sum of the first two roots. Once the roots are obtained, the variable substitutions are reversed with an arrangement of logic gates to obtain the roots of the original equation.

Having covered techniques for efficiently finding roots of quadratic and cubic equations, we turn to a discussion of the decoder implementation, which begins with the syndrome calculator 602.

Though the composite field $GF((2^5)^2)$ is isomorphic to $GF(2^{10})$, the H matrix defined in ITU standard is not suitable for performing syndrome calculation. Instead, we should use $H_{comp}$ for syndrome calculation. For pre-computation of $H_{comp}$, we find the roots of the primitive polynomial $p(x)=x^{10}+x^3+1$ defined in ITU standard in the composite field $GF((2^5)^2)$, which can be done by brute force method using the composite field multiplication defined above. There are 10 conjugate roots that can be found. For simplicity, we take the root with lowest Hamming weight to be the selected $\alpha$, the root of p(x). In Verilog notation, it is 10'h0C1. With the composite field representation of $\alpha$, we can compute $\alpha^i$, $\alpha^{3i}$, and $\alpha^{5i}$ for each column of $H_{comp}$. (The last two rows of $H_{comp}$ are the same as those of the ITU standard's H matrix. Then we can calculate the syndrome of received word via the following equation, $$s = H_{comp} \cdot \vec{r}^T \qquad (18)$$

where $\vec{r}=[r_0, r_1, \ldots, r_{1021}]$ denotes the binary bitstream of the received word. We can choose either partial parallel architecture or full parallel architecture to implement it. As an example of for a partial parallel architecture, we can scan 256 bits each cycle (254 bits for the last cycle) for 4 cycles, accumulating the partial sum in each cycle to the syndrome register. For the full parallel architecture, the syndrome calculator takes 1022-bit inputs. If it is difficult to complete such a big XOR summation within one cycle, we can insert 2 or 3 pipeline stage registers to shorten the critical path.

As (1022, 990) extended BCH code's error correction capability is only 3, the location finder 604 need not use the Berlekamp-Massey algorithm to find the error location polynomial and need not use the Chien search algorithm to factor the error location polynomial. Rather, the error location polynomial can be calculated based on the syndrome. Once we find the error location polynomial, we can solve the linear, quadratic, or cubic equations as provided above to factor the error location polynomial and thereby determine the error locations.

The syndrome calculator 602 feeds a 32-bit syndrome vector to the location finder 604. The first 30 bits are three $GF((2^5)^2)$ evaluation results of the received polynomial at $\alpha^i$, $\alpha^{3i}$, and $\alpha^{5i}$. The last 2-bits are for extra parity checking to lower the miscorrection rate. With an error correction capability of 3, there are four possibilities to consider for the number of errors in the received message: 0, 1, 2, or 3. The error corrector can determine which of the four possibilities applies based on the syndrome.

Refining the approach outlined by Truhachev et al., "Efficient Implementation of 400 Gbps Optical Communication FEC", IEEE Trans. Circuits & Systems, v68n1, Jan 2021, we first define the error location polynomial as follows, which is the reciprocal of the one defined in most textbooks. Let $eloc(X)=\Pi(X+X_i)$, where $X_i=\alpha^{k_i}$, i=1, 2, or 3.

> Case 1: If the first 30 syndrome bits are zero and either of the last 2 syndrome bits are nonzero, the receive message has more errors than can be corrected. If all 32syndrome bits are zero, the receive message contains no errors and the output data is the same as the input.
>
> Case 2: If the receive message contains a single error, $eloc(X)=X+X_1$, with the first ten syndrome bits $S_1=X_1$, the next ten syndrome bits $$S_3 = X_1^3,$$

and the third ten syndrome bits $$S_5 = X_1^5.$$

As $X_1 \neq 0$, $S_1 \neq 0$. Add the cube of $$S_1 \text{ to } S_3, D_3 = S_3 + S_1^3 = X_1^3 + X_1^3 = 0,$$

and the fifth power of $$S_1 \text{ to } S_5, D_5 = S_5 + S_1^5 = X_5^3 + X_5^3 = 0.$$

If $S_1$ is nonzero while $D_3$ and $D_5$ are zero, there is a single error at $k_1$. $k_1$ can be found by taking $\log(X_1)$, or by finding the column of $H_{comp}$ where the first ten bits match $X_1$.

> Case 3: If the receive message contains two errors, $$eloc(X) = (X + X_1)(X + X_2) =$$

$$X^2 + (X_1 + X_2)X + X_1X_2 = X^2 + S_1X + \left(\frac{s_3}{s_1} + S_1^2\right) = X^2 + S_1X + \frac{D_3}{s_1}.$$

Because $$X_1 \neq X_3 \rightarrow S_1 \neq 0.$$

$$X_1X_2 \neq 0 \rightarrow D_3 \neq 0.$$

$$S_5S_1 = \left(X_1^5 + X_2^5\right)(X_1 + X_2) =$$

$$S_3^2 + X_1X_2S_1^4 = S_3^2 + \left(\frac{s_3}{s_1} + S_1^2\right)S_1^4 = S_3^2 + S_3S_1^3 + S_1^6 \rightarrow D_5S_1 = D_3S_3$$

Thus, if $S_1$ is nonzero and $D_3$ is nonzero while a nonzero $D_5S_1=D_3S_3$, there are two errors. The coefficients of the quadratic error polynomial are 1, $S_1$, and $D_3/S_1$, and it can be factored as described previously.

Case 4: If the receive message contains three errors, $X_1$, $X_2$, $X_3 \neq 0$, $X_1 \neq X_2$, $X_2 \neq X_1 \neq X_3$. The error location polynomial is $$eloc(X) = (X + X_1)(X + X_2)(X + X_3) =$$

$$X^3 + (X_1 + X_2 + X_3)X^2 + (X_1 X_2 + X_2 X_3 + X_1 X_3)X + X_1 X_2 X_3,$$

replace $X$ with $X_1$, $X_2$, or $X_3$, $$X_1^3 + (X_1 + X_2 + X_3)X_1^2 + (X_1 X_2 + X_2 X_3 + X_1 X_3)X_1 + X_1 X_2 X_3 = 0 \quad (19)$$

$$X_2^3 + (X_1 + X_2 + X_3)X_2^2 + (X_1 X_2 + X_2 X_3 + X_1 X_3)X_2 + X_1 X_2 X_3 = 0 \quad (20)$$

$$X_3^3 + (X_1 + X_2 + X_3)X_3^2 + (X_1 X_2 + X_2 X_3 + X_1 X_3)X_3 + X_1 X_2 X_3 = 0 \quad (21)$$

By summing the above 3 equations:

$$S_3 + S_1^3 + (X_1 X_2 + X_2 X_3 + X_1 X_3)S_1 + X_1 X_2 X_3 = 0 \quad (22)$$

From the weighted sum of equations 19-21

$$(19) \times X_1^2 + (20) \times X_2^2 + (21) \times X_3^2$$

we get $$S_5 + S_1^5 + (X_1 X_2 + X_2 X_3 + X_1 X_3)S_3 + X_1 X_2 X_3 S_1^2 = 0 \quad (23)$$

$$\begin{bmatrix} S_1 & 1 \\ S_3 & S_1^2 \end{bmatrix} \begin{bmatrix} X_1 X_2 + X_2 X_3 + X_1 X_3 \\ X_1 X_2 X_3 \end{bmatrix} = \begin{bmatrix} D_3 \\ D_5 \end{bmatrix}$$

Next, we will show the matrix, $$\begin{bmatrix} S_1 & 1 \\ S_3 & S_1^2 \end{bmatrix},$$

is invertible.

$$\det\left(\begin{bmatrix} S_1 & 1 \\ S_3 & S_1^2 \end{bmatrix}\right) = S_3 + S_1^3 = D_3,$$

i.e., we need to show that $D_3 \neq 0$. First, we show that $$D_3 = (X_1 + X_2)(X_2 + X_3)(X_1 + X_3)$$

$$(X_1 + X_2)(X_2 + X_3)(X_1 + X_3) = (S_1 + X_3)(S_1 + X_1)(S_1 + X_2) \quad (24)$$

$$= S_1^3 + (X_1 + X_2 + X_3)S_1^2 + (X_1 X_2 +$$

$$X_2 X_3 + X_1 X_3)S_1 + X_1 X_2 X_3$$

$$= (X_1 X_2 + X_2 X_3 + X_1 X_3)S_1 + X_1 X_2 X_3$$

-continued
By Equations (22) and (24), $$D_3 = (X_1 + X_2)(X_2 + X_3)(X_1 + X_3) \neq 0,$$

$$\begin{bmatrix} \sigma_2 \\ \sigma_3 \end{bmatrix} = \begin{bmatrix} X_1 X_2 + X_2 X_3 + X_1 X_3 \\ X_1 X_2 X_3 \end{bmatrix} = D_3^{-1} \begin{bmatrix} S_1^2 & 1 \\ S_3 & S_1 \end{bmatrix} \begin{bmatrix} D_3 \\ D_5 \end{bmatrix} = \begin{bmatrix} \dfrac{D_5}{D_3} + S_1^2 \\ S_3 + \dfrac{S_1 D_5}{D_3} \end{bmatrix}$$

$$eloc(X) = X^3 + S_1 X^2 + \left(\frac{D_5}{D_3} + S_1^2\right)X + S_3 + \frac{S_1 D_5}{D_3} \quad (25)$$

$$= X^3 + S_1 X^2 + \left(\frac{D_5}{D_3} + S_1^2\right)X + \frac{S_3 D_3 + S_1 D_5}{D_3}$$

Thus, if $S_1$ is nonzero, $D_3$ is nonzero, and $S_3 D_3 + S_1 D_5$ is nonzero, there are three errors. The coefficients of the cubic error location polynomial are $$1, S_1, \left(\frac{D_5}{D_3} + S_1^2\right), \text{ and } \frac{S_3 D_3 + S_1 D_5}{D_3},$$

and it can be factored as described previously.

To summarize, the conditions for the above 4 cases are:

$$cond_1: S_1 = 0 \;\&\&\; S_3 = 0 \;\&\&\; S_5 = 0;$$

$$cond_2: S_1 \neq 0 \;\&\&\; D_3 = 0 \;\&\&\; D_5 = 0;$$

$$cond_3: S_1 \neq 0 \;\&\&\; D_3 \neq 0 \;\&\&\; D_5 S_1 = D_3 S_3;$$

$$cond_4: D_3 \neq 0 \;\&\&\; S_3 D_3 + S_1 D_5 \neq 0;$$

By now, we have shown how to calculate error location polynomials according to three 10-bit syndromes. By the method proposed in Section 2, if we found that the number of roots is less than the degree of the error location polynomial, we can justify that the received word can't be decodable.

With the foregoing in mind, FIG. 8 is a flow diagram of an illustrative decoding method enabling a BCH decoder to be implemented with an application-specific arrangement of logic gates and two relatively small look up tables. Alternative implementations may include programmable logic devices, field-programmable gate arrays, embedded controllers or processors executing suitable firmware, and general purpose processors executing suitable software from memory.

Block 802 represents a determination of the syndrome values $S_1$, $S_3$, $S_5$, P by syndrome calculator 602. This determination corresponds to a multiplication of the receive message vector by the $H_{comp}$ matrix, which is implementable by an array of logic gates (AND gates for multiplications and XOR gates for summing the products). Though shown as being contingent on later-described tests, blocks 812, 820, and 838 may be speculatively performed ahead of time by syndrome calculator 602, also via an array of logic gates that carry out the addition, multiplication, power, root, and inverse multiplication operations to determine the values of the relevant variables.

Block 804 represents a test by location finder 604 to determine if the syndrome values $S_1$, $S_3$, $S_5$, are all zero, corresponding to the case where no correctable errors are present. Though shown as being contingent, blocks 806, 814, 822, and 832 may be speculatively performed by location finder 604 in parallel with block 804 to determine which error locating procedure should be performed. If syndrome values $S_1$, $S_3$, $S_5$, are all zero, location finder 604 checks whether the parity value P is zero in block 806. If not, the receive message vector is flagged in block 808 as having uncorrectable errors. Regardless of whether there are no errors or the errors are uncorrectable, the receive message vector is produced as output data in block 810.

Block 812 represents the determination of values $$D_3 = S_3 + S_1^3 \text{ and } D_5 = S_5 + S_1^5.$$

Block 814 represents a test of whether these values are both zero, corresponding to the case where the receive message contains a single error. If so, block 816 represents the location finder's determining of the single error location from the $S_1$ syndrome value. As with the locations corresponding to roots of any of the polynomials, an indexing circuit can determine the bit index of an error in the receive message vector by comparing the first 10 bits of each column of $H_{com}$ with the root. If the root equals the first 10 bits, the column index (which equals the bit index of the receive message vector) is an error location. A parity verification can be performed by accumulating the last two bits of the $H_{com}$ columns at the error locations to calculate the parity delta syndrome. If the accumulated parity delta syndrome for all error locations is equal to the syndrome P value, then the errors are correctable.

Block 818 represents correction of the located error(s) by inverting the receive message bit at each error location. Though not expressly shown here, this correction may be made contingent on the determination that the located errors are correctable.

Block 820 represents the calculation of the product values $D_5 S_1$ and $D_3 S_3$. Block 822 represents a test of whether these values are equal, corresponding to the case where the receive message contains two errors. If so, block 824 represents the location finder's determination of coefficients for the quadratic error locator polynomial and use of variable substitution to obtain the trailing coefficient for Equation 9.

$$s = \frac{D_3}{S_1^3} = \frac{S_3}{S_1^3} + 1$$

Using the principles described previously, an array of logic gates can be used to obtain a product of a syndrome value vector with a quadratic solution matrix to obtain the two roots corresponding to the two error locations. The solution matrix can incorporate a reversal of the variable substitution used to obtain Equation 9. Block 826 represents the indexing circuit using the roots to find the matching $H_{com}$ column indices, which equal the bit indices of the receive message vector where the errors can be found and corrected in block 818 if the errors are determined to be correctable.

If blocks 804, 814, and 822, all yield negative tests, the receive message vector contains at least three errors. Block 832 represents a test by the location finder 604 to determine if the variable-substituted cubic polynomial is a cubic of the first type, in which case the trailing coefficient value is $$d = D_3 = S_3 + S_1^3.$$

In block 834 the location finder uses the depth-341 lookup table to obtain one of the three roots and uses it to calculate the other two roots. Supporting logic gates can be used to reverse the variable substitution, i.e., to add $S_1$ to each root. Block 836 represents the indexing circuit using the roots to find the matching $H_{com}$ column indices, which equal the bit indices of the receive message vector where the errors can be found and corrected in block 818 if the errors are determined to be correctable.

If the block 832 test is negative, the variable-substituted cubic is of the second type. Block 838 represents the calculation of the trailing coefficient value $$d = \left\{ \frac{D_3^5}{D_5^3} \right\}^{1/2} = \left\{ \frac{(S_3 + S_1^3)^5}{(S_5 + S_1^5)^3} \right\}^{1/2}.$$

In block 840 the location finder uses the depth-170 lookup table to obtain two of the three roots, combining them to calculate the third root. Supporting logic gates can be used to reverse the variable substitution, i.e., multiplying each of them by $$\left\{ \frac{S_5 + S_1^5}{S_3 + S_1^3} \right\}^{1/2}$$

and adding $S_1$. Block 842 represents the use of the roots to find the matching $H_{com}$ column indices, which equal the bit indices of the receive message vector where the errors can be found and corrected in block 818 if the errors are determined to be correctable.

Though operations are described sequentially, it should be understood that the operations can be reordered, parallelized, and/or combined. For example, block 824 can be implemented as an array of logic gates to obtain two polynomial roots as a product of a syndrome value vector and a quadratic solution matrix. The quadratic solution matrix may combine the operations corresponding to a determination of a quadratic equation's trailing coefficient value s, a determination of the quadratic equation's roots, and a reversal of a variable substitution. Any sequence of operations that can each be expressed as a linear transformation can be combined into a single combined linear transformation.

Each of the BCH decoder components (syndrome calculator, error location finder, and error correction logic) can be pipelined. The syndrome calculator operates to compute the product of 1×1022 vector and 1022×32 matrix. If all 1022 input bits are available, the calculation can be performed via an AND-XOR gate array. The XOR gates can be organized in a binary tree. One contemplated implementation uses 3 pipeline stage registers to shorten the critical path. One contemplated implementation of the location finder, including error location polynomial calculation and factorization of the error location polynomial, is pipelined with 4 stage registers. If the number of roots found in the underlying field is smaller than the degree of the error location polynomial, the locator designates the errors as uncorrectable. Otherwise, the error correction logic will perform further check with the parity bits (the last two extended syndrome bits), accumulating the last two bits of the selected error location columns of the check matrix $H_{com}$ to obtain delta syndromes. The error correction logic takes 4 cycles to complete this further check. If the decoder is parallel out, i.e., all 1022 output bits are sent out simultaneously, the error correction logic needs only one cycle to correct the error bits. Hence, the latency of the decoder is 12 cycles.

This BCH decoder design was synthesized using a commercially available technology library. The target frequency was selected as 937.5 MHz with 20% margin. The synthesis tool used was Synopsis Design Compiler. The total cell area of BCH decoder came out to 9311 um^2. Standard voltage threshold (SVT) device area is 91%, low voltage threshold (LVT) device area is 7.54%, and ultra-low voltage threshold (ULVT) device area is 1.45%.

Numerous alternative forms, equivalents, and modifications will become apparent to those skilled in the art once the above disclosure is fully appreciated. It is intended that the claims be interpreted to embrace all such alternative forms, equivalents, and modifications that are encompassed in the scope of the appended claims.

what is claimed is:

1. A circuit for correcting bit errors in a received version of a RS or BCH encoded bit stream, the circuit comprising:

a syndrome calculator having a first array of logic gates to obtain syndrome values as a product of a receive message vector and a parity check matrix, the syndrome values including at least a first ten-bit syndrome value $S_1$, a second ten-bit element syndrome value $S_3$, and a third ten-bit syndrome value $S_5$;

a location finder to derive a number of errors from the syndrome values, the location finder having:

a second array of logic gates to obtain two polynomial roots as a product of a syndrome value vector and a quadratic solution matrix when the number of errors is two, the quadratic solution matrix corresponding to a determination of a quadratic equation's trailing coefficient value s, a determination of the quadratic equation's roots, and a reversal of a variable substitution; and an index circuit to determine a bit index for each of the polynomial roots; and an error corrector to receive for each receive message vector a set of zero or more bit indexes representing error locations in the receive message vector, wherein said error corrector corrects a bit error at each bit index in the set for that receive message vector.

2. The circuit of claim 1, wherein the reversal of the variable substitution is representable as $x=S_1 \cdot t$, and the trailing coefficient value is representable as $$s = \frac{S_3}{S_1^3} + 1.$$

3. The circuit of claim 1, wherein the first array of logic gates and the second array of logic gates each comprises a set of logical AND gates to implement bitwise multiplications and a set of logical XOR gates to implement bitwise additions.

4. The circuit of claim 1, wherein the syndrome values include an error parity value P, wherein the error corrector is configured to accumulate a parity delta of the parity check matrix based on the set of bit indexes and configured to invert receive message vector bits corresponding to the bit indexes if the parity delta indicates the bit errors are correctable.

5. The circuit of claim 1, wherein the location finder further includes:

a first lookup table with supporting logic gates to obtain three polynomial roots when the number of errors is three and $$(S_5 + S_1^5) = 0,$$

the tree polynomial roots corresponding to roots of a cubic equation $x^3 + d$ with d representable as $$S_3 + S_1^3,$$

and the first lookup table having a depth of no more than 341.

6. The circuit of claim 5, wherein the first lookup table contains a single polynomial root or error location and the supporting logic gates derive remaining polynomial roots or error locations from the single polynomial root or error location.

7. The circuit of claim 5, wherein the location finder further includes:

a second lookup table with supporting logic gates to obtain three polynomial roots when the number of errors is three and $$(S_5 + S_1^5) \neq 0,$$

the three polynomial roots corresponding to roots of a cubic equation $x^3 + x + d$ with d representable as $$\left\{ \frac{(S_3 + S_1^3)^5}{(S_5 + S_1^5)^3} \right\}^{1/2},$$

and the first lookup table having a depth of no more than 170.

8. The circuit of claim 7, wherein the second lookup table contains two polynomial roots or error locations and the supporting logic gates for the second lookup table derive a remaining polynomial root or error location from the two polynomial roots or error locations contained in the second lookup table.

9. The circuit of claim 1, wherein the location finder is configured to provide syndrome value $S_1$ as a polynomial root when the number of errors is one.

10. The circuit of claim 1, wherein the receive message vector contains exactly 1022 bits and the parity check matrix, $H_{comp}$, has $32 \times 1022$ binary elements representing powers of a primitive polynomial root in a composite field $GF((2^5)^2)$.

11. An error correction method that comprises:

obtaining syndrome values corresponding to a product of a receive message vector and a parity check matrix, the syndrome values including at least a first ten-bit syndrome value $S_1$, a second ten-bit element syndrome value $S_3$, and a third ten-bit syndrome value $S_5$;

converting the syndrome values into a set of zero or more polynomial roots corresponding to error locations in the receive message vector, said converting including:

deriving a number of errors from the syndrome values; and when the number of errors is two, using an array of logic gates to obtain two polynomial roots corresponding to a product of a syndrome value vector and a quadratic solution matrix, the quadratic solution matrix corresponding to a determination of a quadratic equation's trailing coefficient value s, a determination of the quadratic equation's roots, and a reversal of a variable substitution; and determining a bit index for each polynomial root in the set, the bit indexes indicating the error locations to be corrected in the receive message vector.

12. The error correction method of claim 11, wherein the reversal of the variable substitution is representable as $x=S_1 \cdot t$, and the trailing coefficient value is representable as $$ s = \frac{S_3}{S_1^3} + 1. $$

13. The error correction method of claim 11, wherein the array of logic gates comprises a set of logical AND gates to implement bitwise multiplications and a set of logical XOR gates to implement bitwise additions.

14. The error correction method of claim 11, wherein the syndrome values include an error parity value P, wherein the method further comprises:

accumulating a parity delta from the parity check matrix based on the bit indexes; and inverting each receive message vector bit corresponding to one of the bit indexes if the parity delta indicates the bit errors are correctable.

15. The error correction method of claim 11, wherein the converting further includes:

using a first lookup table with supporting logic gates to obtain three polynomial roots when the number of errors is three and $$ \left(S_5 + S_1^5\right) = 0, $$

the three polynomial roots corresponding to roots of a cubic equation $x^3+d$ with d representable as $$ S_3 + S_1^3, $$

the first lookup table having a depth of no more than 341.

16. The error correction method of claim 15, wherein the converting further includes:

using a second lookup table with supporting logic gates to obtain three polynomial roots when the number of errors is three and $$ \left(S_5 + S_1^5\right) \neq 0, $$

the three polynomial roots corresponding to roots of a cubic equation $x^3+x+d$ with d representable as $$ \left\{ \frac{\left(S_3 + S_1^3\right)^5}{\left(S_5 + S_1^5\right)^3} \right\}^{1/2}, $$

and the first lookup table having a depth of no more than 170.

17. The error correction method of claim 11, further comprising using the syndrome value $S_1$ as a polynomial root when the number of errors is one.

18. The error correction method of claim 11, wherein the receive message vector contains exactly 1022 bits and the parity check matrix, $H_{comp}$, has 32×1022 binary elements representing powers of a primitive polynomial root in a composite field $GF((2^5)^2)$.

19. The error correction method of claim 11, wherein said deriving the number of errors includes:

determining that the number of errors is zero if the syndrome values are all zero;

determining that the number of errors is one if syndrome value $S_1$ is nonzero and remaining syndrome values are all zero;

determining that the number of errors is two if $$ \left(S_5 + S_1^5\right)S_1 = \left(S_3 + S_1^3\right)S_3; $$

and otherwise determining that the number of errors is three.

20. The error correction method of claim 19, further comprising:

verifying that roots exist for the quadratic equation if the number of roots is two, said verifying including determining that a binary representation of trailing coefficient s has a bit $s_7=0$.

21. An error correction method that comprises:

obtaining syndrome values corresponding to a product of a receive message vector and a parity check matrix, the syndrome values including at least a first ten-bit syndrome value $S_1$, a second ten-bit element syndrome value $S_3$, and a third ten-bit syndrome value $S_5$;

converting the syndrome values into a set of zero or more polynomial roots corresponding to error locations in the receive message vector, said converting including:

deriving a number of errors from the syndrome values; and when the number of errors is three, using a first lookup table with supporting logic gates to obtain three polynomial roots when $$ \left(S_5 + S_1^5\right) = 0, $$

the three polynomial roots corresponding to roots of a cubic equation $x^3+d$ with d representable as $$ S_3 + S_1^3, $$

the first lookup table having a depth of no more than 341; and determining a bit index for each polynomial root in the set, the bit indexes indicating the error locations to be corrected in the receive message vector.

22. The error correction method of claim 21, wherein the converting further includes:

using a second lookup table with supporting logic gates to obtain three polynomial roots when the number of errors is three and $$\left(S_5 + S_1^5\right) \neq 0,$$

the three polynomial roots corresponding to roots of a cubic
equation $x^3 + x + d$ with d representable as $$\left\{ \frac{\left(S_3 + S_1^3\right)^5}{\left(S_5 + S_1^5\right)^3} \right\}^{1/2},$$

and the first lookup table having a depth of no more than
170.

23. The error correction method of claim 21, wherein the
syndrome values include an error parity value P, wherein the
method further comprises:

accumulating a parity delta from the parity check matrix
based on the bit indexes; and inverting each receive message vector bit corresponding
to one of the bit indexes if the parity delta indicates
these receive message vector bits are correctable.

24. The error correction method of claim 21, wherein the
receive message vector contains exactly 1022 bits and the
parity check matrix, $H_{comp}$, has 32×1022 binary elements
representing powers of a primitive polynomial root in a
composite field $GF((2^5)^2)$.

\* \* \* \* \*